United States Patent
Lee

(12) United States Patent (10) Patent No.: US 6,282,679 B1
Lee (45) Date of Patent: Aug. 28, 2001

(54) PATTERN AND METHOD OF METAL LINE PACKAGE LEVEL TEST FOR SEMICONDUCTOR DEVICE

(75) Inventor: Kang Yeul Lee, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/188,235

(22) Filed: Nov. 9, 1998

(30) Foreign Application Priority Data

Dec. 30, 1997 (KR) .................................................. 97-79125
Feb. 4, 1998 (KR) .................................................... 98-3064

(51) Int. Cl.$^7$ ............................. G01R 31/28; H01L 21/00
(52) U.S. Cl. ................................. 714/724; 438/11; 257/48
(58) Field of Search ................................... 438/11, 18, 14, 438/629, 647, 927; 324/765; 257/48, 528, 758, 773, 776; 714/724, 728

(56) References Cited

U.S. PATENT DOCUMENTS 5,264,377 * 11/1993 Chesire et al. .......................... 438/11
5,801,394 * 9/1998 Isobe ....................................... 257/48
5,846,848 * 12/1998 Chih-Sheng et al. ................... 438/11

OTHER PUBLICATIONS

Harry A. Schafft; "*Thermal Analysis of Electromigration Test Structures*"; IEEE Transaction on Electron Devices, vol. ED–34, No. 3; Mar. 1987; pp. 664–672.
Keni Hinode; "*Dependence of Electromigration Damage on Current Density*"; J. Appl.Phys. 74(1), Jul. 1, 1993; pp. 201–206.
M. Shatzkes; "*A model for conductor failure considering diffusion concurrently with Electromigraiton resulting in a current exponent of 2*"; J. Appl. Phys.59 (11), Jun. 1, 1986; pp. 3890–3893.
Ellis et al., Polycrystalline diamond film flow sensor: Solid–State Sensor and Actuator Workshop, IEEE pp. 132–134, 1990.*

* cited by examiner

*Primary Examiner*—Emmanuel L. Moise
(74) *Attorney, Agent, or Firm*—Morgan, Lewis & Bockius LLP

(57) ABSTRACT

A pattern and method of a metal line package level test for a semiconductor device, which is capable of efficiently testing characteristic of a metal line. The metal line package level test pattern includes a metal line for test, a current applying pad which is connected to both ends of the metal line, for applying a current to the metal line, a voltage sensing pattern formed at both ends of the metal line, for sensing a voltage of the metal line, and a heater for varying the temperature of the current applying pad.

22 Claims, 5 Drawing Sheets

PATTERN AND METHOD OF METAL LINE PACKAGE LEVEL TEST FOR SEMICONDUCTOR DEVICE

BACKGROUND OF THE INVENTION

1. Field of the Invention

The present invention relates to a semiconductor device, and more particularly, to a pattern and method of a metal line package level test for a semiconductor device, which is capable of efficiently testing characteristic of a metal line.

2. Discussion of the Related Art

There are current, temperature, temperature gradient, and current gradient in main factors which cause electromigration (EM) in a metal line of a semiconductor device. However, taking account of only current and temperature factors, characteristic (lifetime) of the metal line in the semiconductor device is presently tested.

A background art metal line package level test pattern for a semiconductor device will be described with reference to the accompanying drawings.

FIGS. 1a and 1b are layouts of background art metal line package level test patterns for a semiconductor device.

FIG. 1a shows a JEDEC test pattern. As shown in FIG. 1a, a connecting area 3 is formed between a current applying pad 1 and a test line 2. The connecting area 3 has a width which is to be gradually narrowed toward the test line 2 so as to minimize temperature gradient and current gradient during test.

Electromigration of the metal line using the JEDEC test pattern is tested in such a manner that a current is applied to the current applying pad 1 and then a voltage of a voltage sensing area 4 at both ends of the test line 2 is measured.

In the JEDEC test pattern, the connecting area 3 is formed with a gradient to prevent temperature gradient during test. However, the JEDEC test pattern has a problem that fails to completely prevent temperature gradient by Joule heating. In addition, the JEDEC test pattern has a problem that it is likely to cause electromigration as a line width of the connecting area 3 is wider than that of the test line 2.

FIG. 1b shows a Lloyd test pattern. Referring to FIG. 1b, a connecting area 3 having a plurality of narrow lines is formed between a current applying pad 1 and a test line 2. In the same manner as FIG. 1a, the connecting area 3 has a width which is to be gradually narrowed toward the test line 2 so as to minimize temperature gradient and current gradient during test. A voltage sensing area 4 is formed at both ends of the test line 2.

Electromigration of the metal line using the Lloyd test pattern is tested in such a manner that a current is applied to the current applying pad 1 and then a voltage of the voltage sensing area 4 is measured.

In the Lloyd test pattern, the gradient connecting area 3 is formed to have the plurality of narrow lines so as to minimize temperature gradient and current gradient during test.

However, since the aforementioned background art metal line package level test patterns fail to effectively prevent temperature gradient and current gradient during the metal line test, in particular, temperature gradient by Joule heating, there exists a problem that the metal line test is not exactly performed.

SUMMARY OF THE INVENTION

Accordingly, the present invention is directed to a pattern and method of a metal line package level test for a semiconductor device that substantially obviates one or more of the problems due to limitations and disadvantages of the related art.

An object of the present invention is to provide a pattern and method of a metal line package level test for a semiconductor device which efficiently tests characteristic of a metal line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a metal line package level test pattern for a semiconductor device according to the present invention includes a metal line for test, a current applying pad connected to both ends of the metal line, for applying a current to the metal line, a voltage sensing pattern formed at both ends of the metal line, for sensing a voltage of the metal line, and a heater for varying temperature of the current applying pad.

In another aspect, a method of a metal line package level test pattern for a semiconductor device, including a metal line for test, a current applying pad connected to both ends of the metal line, for applying a current to the metal line, and a voltage sensing pattern formed at both ends of the metal line, for sensing a voltage of the metal line, according to the present invention, includes the steps of applying a current to both ends of the current applying pad, making the temperature of the current applying pad relatively higher than the metal line, and sensing a voltage of the metal line via the voltage sensing pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
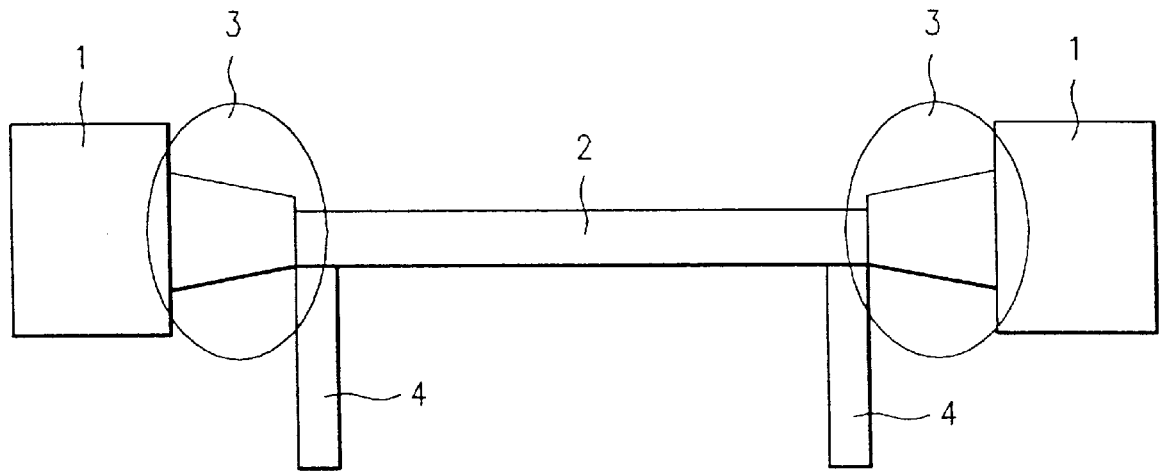
FIGS. 1a and 1b are layouts of background art metal line package level test patterns for a semiconductor device.
Figure 1B:
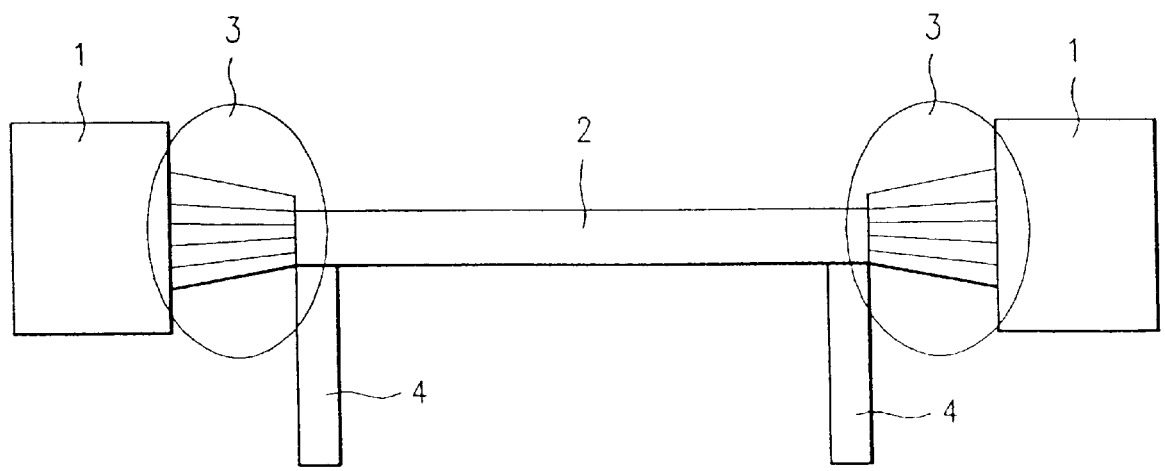
Figure 2:
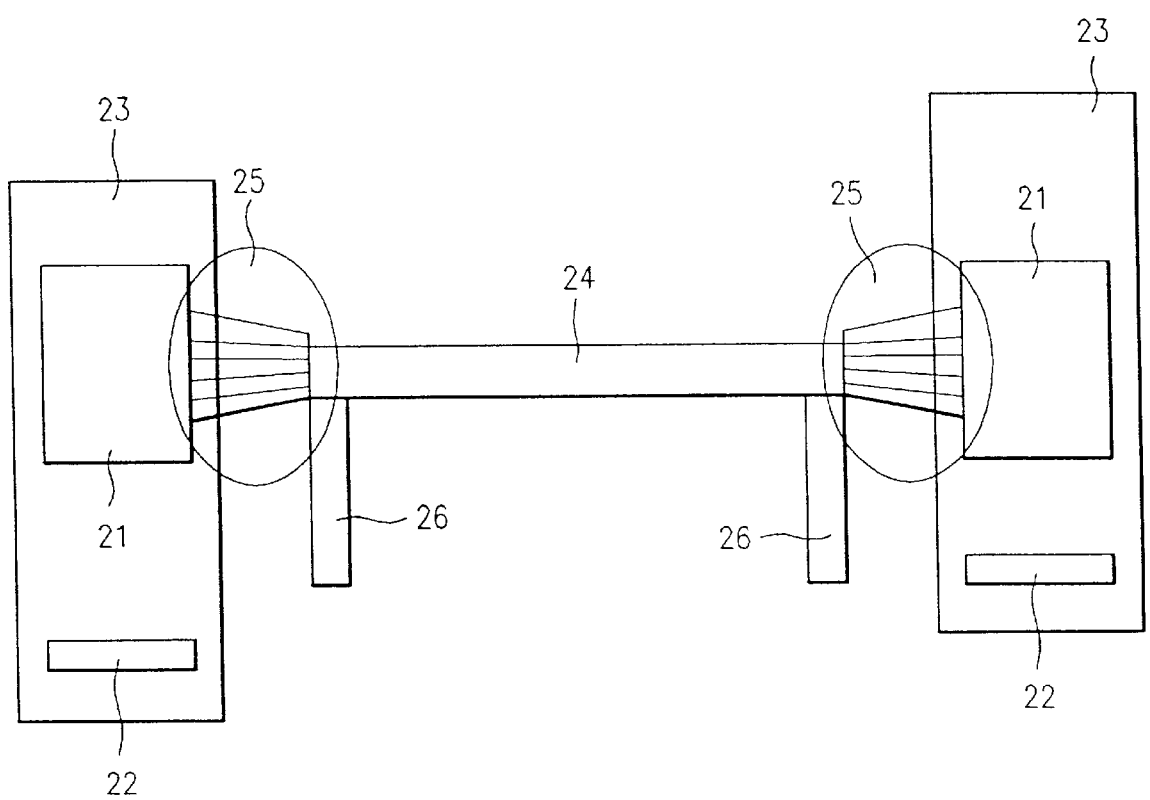
FIG. 2 is a layout of a metal line package level test pattern for a semiconductor device according to the first embodiment of the present invention.
Figure 3:
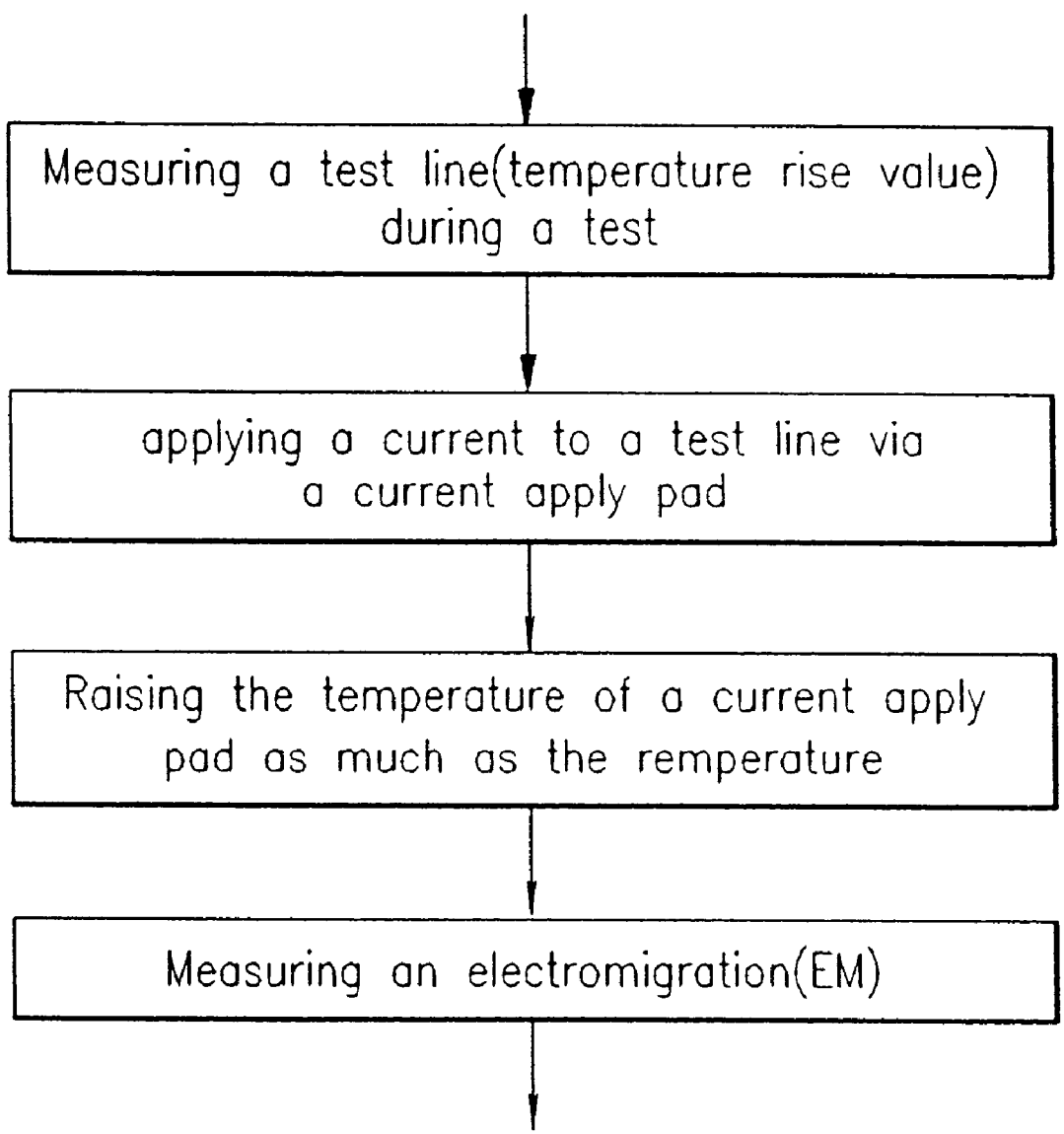
FIG. 3 is a flow chart illustrating a metal line package level test pattern for a semiconductor device according the first embodiment of the present invention.

FIG. 2 is a layout of a metal line package level test pattern for a semiconductor device according to the first embodiment of the present invention. FIG. 3 is a flow chart illustrating a metal line package level test pattern for a semiconductor device according the first embodiment of the present invention.

The metal line package level test pattern according to the first embodiment of the present invention is intended that temperature gradient by Joule heating is prevented pertinently.

The pattern includes a poly heating area 23, a connecting area 25, and a voltage sensing area 26. The poly heating area 23 is formed at both ends of a test line 24 and has a current applying pad 21 for applying a current during metal line test and a metal line for temperature measurement 22 for measuring the temperature by heating during metal line test. The connecting area 25 is formed with a plurality of narrow lines and connects the test line 24 to the poly heating area 23. The voltage sensing area 26 is formed at both ends of the test line 24.

The width of the connecting area 25 is narrower toward the test line 24 from the current applying pad 21.

The temperature of the current applying pad 21 is raised by the poly heating area 23 as much as the temperature rise by Joule heating during test.

Thus, the temperature gradient factor is completely removed by compensating for the temperature of the current applying pad 21 through the poly heating area 23.

The metal line for temperature measurement 22 is adapted to measure resistance gradient, in such a way that the current applying pad 21 can accurately rise in temperature.

An electromigration test of metal line using the metal line package level test pattern according to the present invention proceeds as shown in FIG. 3.

First of all, the temperature rise value of the test line 24 is measured during a test, to use the temperature rise value in accordance with a current applying condition which has been already known. Current is applied to the test line 24 by the current applying pad 21.

The temperature of the current applying pad 21 is raised through the poly heating area 23 as much as the temperature rise value, in order to compensate for the temperature gradient of the test line 24. Then, the electromigration test of metal line is performed.

Accordingly, the temperature gradient by Joule heating during test can be completely removed by the metal line package level test pattern according to the first embodiment of the present invention.

The metal line package level test pattern according to the second embodiment of the present invention will be described with reference to FIG. 4 and FIG. 5.

Figure 4:
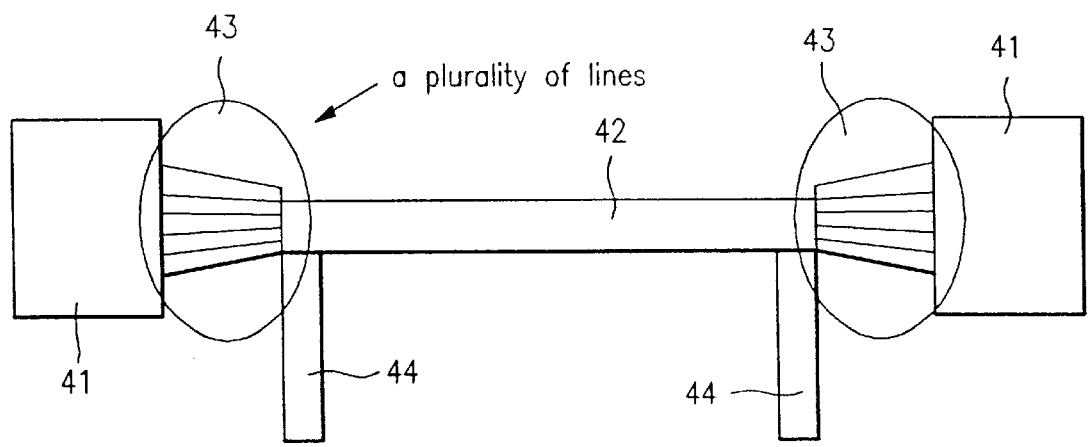
FIG. 4 is a layout of a metal line package level test pattern for a semiconductor device according to the second embodiment of the present invention.
Figure 5:
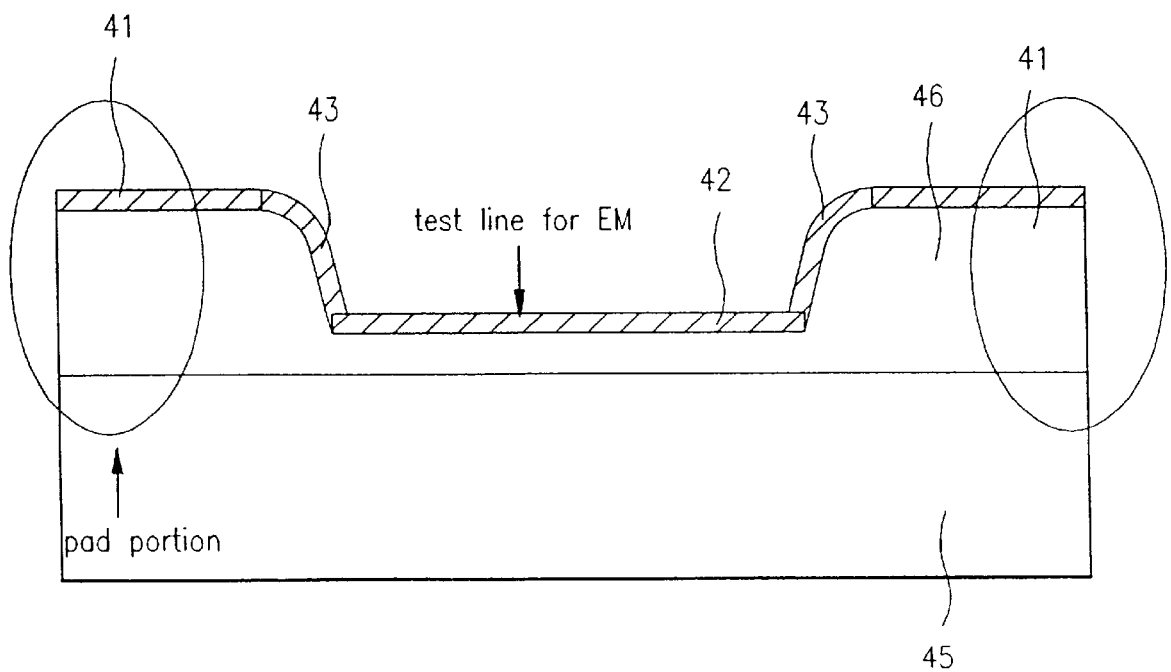
FIG. 5 is a sectional view illustrating a metal line package level test pattern for a semiconductor device according to the second embodiment of the present invention.

FIG. 4 is a layout of a metal line package level test pattern for a semiconductor device according to the second embodiment of the present invention. FIG. 5 is a sectional view illustrating a metal line package level test pattern for a semiconductor device according to the second embodiment of the present invention.

The metal line package level test pattern according to the second embodiment of the present invention is intended that, using thermal dissipation characteristic depending on a thickness of an oxide film adjacent to a test pattern, a metal line test is not affected by temperature gradient caused by Joule heating during the metal line test.

The thermal dissipation characteristic that is inversely to the thickness of the oxide film is well known in the paper, "Thermal Analysis of Electromigration Test Structures" by Harry A. Schafft (Member, IEEE) (See "IEEE TRANSACTIONS ON ELECTRON DEVICES, VOL. ED-34, NO. 3, MARCH 1987").

The metal line package level test pattern for the semiconductor device according to the second embodiment of the present invention includes a test line 42 for use in the metal line test, a current applying pad 41, a connecting area 43, and a voltage sensing area 44. The current applying pad 41 is connected to both ends of the test line 42, for applying a current during the metal line test. The connecting area 43 has a plurality of narrow lines, of which an overall width is varied, and connects the test line 42 to the current applying pad 41. The voltage sensing area 44 is formed at both ends of the test line 42.

At this time, a test pattern for electromigration is formed on an oxide film 46 on a semiconductor substrate 45. In the second embodiment of the present invention, the oxide film 46 is formed with different thicknesses. In other words, the oxide film is thickly formed at a portion, where temperature gradient (temperature increase) by Joule heating should be compensated, as compared to the other portion. The portion where the temperature gradient should be compensated is the current applying pad 41. Thus, the oxide film 46 at the current applying pad 41 is thicker than that at the test line 42.

At this time, the oxide film 46 at the connecting area 43 is formed with a slow gradient toward the test line 42 from the current applying pad 41.

The connecting area 43 has a plurality of branch lines having a certain line width. The width of the connecting area 43 is to be gradually narrowed toward the test line 42 from the current applying pad 41.

To identify whether or not compensation of temperature gradient is exactly performed by the thick oxide film 46, a metal line (not shown) for temperature measurement may be further formed in the current applying pad 41. In this case, resistance variable constant of the metal line for temperature measurement is measured when compensating for temperature, so that compensation status of temperature in the current applying pad 41 can exactly be identified.

The metal line package level test pattern according to the third embodiment of the present invention will be described with reference to FIG. 6.

Figure 6:
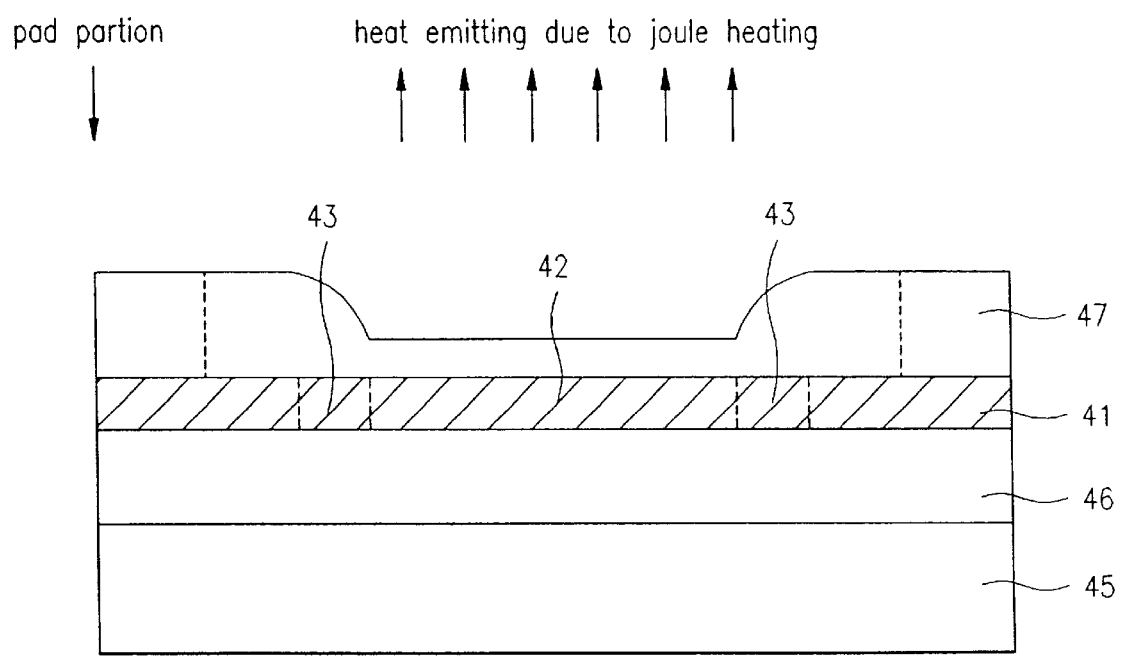
FIG. 6 is a sectional view illustrating a metal line package level test pattern for a semiconductor device according to the third embodiment of the present invention.

FIG. 6 is a sectional view illustrating a metal line package level test pattern for a semiconductor device according to the third embodiment of the present invention.

The metal line package level test pattern according to the third embodiment of the present invention includes a test line 42 for use in a metal line test, a current applying pad 41, a connecting area 43, a voltage sensing area 44, and a heat emitting film 47. The current applying pad 41 is connected to both ends of the test line 42 and applies a current during the metal line test. The connecting area 43 has a plurality of narrow lines, of which an overall width is varied, and connects the test line 42 to the current applying pad 41. The voltage sensing area 44 is formed at both ends of the test line 42. The heat emitting film 47 is formed on the test line 42 and emits heat by Joule heating which occurs during the metal line test.

Such a test pattern for electromigration is formed on an oxide film 46 on a semiconductor substrate 45. The heat emitting film 47 is formed on the test pattern to compensate for temperature gradient (temperature increase) by Joule heating.

In this case, the compensation of temperature is carried out in such a manner that heat of a portion where temperature increase occurs is emitted instead of increasing temperature of a portion where heat emission does not occur. As a result, inaccuracy due to temperature gradient during the metal line test is removed.

In such a test, it is necessary to emit heat due to temperature increase in the test line 42. Therefore, the heat emitting oxide film 47 is formed on the test line 42.

The heat emitting oxide film 47 includes a first heat emitting oxide film, a second heat emitting oxide film, and a third heat emitting oxide film. The first heat emitting oxide film has a first thickness. The second heat emitting oxide film has a second thickness thicker than the first thickness. The third heat emitting oxide film has a variable thickness between the first thickness and the second thickness.

Since the thickness of the oxide film is inversely proportional to the thermal dissipation, supposing that the first heat emitting oxide film is thinner than any other portion, heat emitting efficiency of the second heat emitting oxide film is lower than that of the first heat emitting oxide film.

In the metal line package level test pattern according to the third embodiment of the present invention, temperature gradient by Joule heating during the test is completely prevented, thereby accurately testing electromigration of the metal line.

The aforementioned metal line package level test pattern of the present invention has the following advantages.

Electromigration is tested in a stage of a pertinently compensating for the temperature gradient generated during test, thereby accurately testing the metal line. That is, the temperature gradient by Joule heating is compensated to enhance accuracy of the metal line test, even though excessive stress is applied during the test.

Taking account of thermal dissipation characteristic of the oxide film adjacent to the test pattern, temperature gradient by Joule heating during the metal line test can completely be avoided by partial temperature compensation or heat emitting, so that the metal line in actual mass production can exactly be tested.

It will be apparent to those skilled in the art that various modifications and variations can be made in the pattern and method of a metal line package level test pattern for a semiconductor device according to the present invention without departing from the spirit or scope of the invention. Thus, it is intended that the present invention covers the modifications and variations of the invention provided they come within the scope of the appended claims and their equivalents.

What is claimed is:

1. A metal line package level test pattern for a semiconductor device comprising:
   a metal line for test;
   a current applying pad connected to both ends of the metal line, for applying a current to the metal line;
   a voltage sensing pattern formed at both ends of the metal line, for sensing a voltage of the metal line; and
   a heater for varying temperature of the current applying pad, such that a temperature and current gradient between the metal line and the current applying pad is prevented during a metal line package level test.

2. The metal line package level test pattern for a semiconductor device as claimed in claim 1, wherein the metal line has a certain width which is narrower than that of the current applying pad.

3. The metal line package level test pattern for a semiconductor device as claimed in claim 1, further comprising a connecting area for connecting the metal line with the current applying pad.

4. The metal line package level test pattern for a semiconductor device as claimed in claim 3, wherein the connecting area has a plurality of branches for connecting the metal line to the current applying pad.

5. The metal line package level test pattern for a semiconductor device as claimed in claim 3, wherein the connecting area has a width that becomes narrower toward the metal line from the current applying pad.

6. The metal line package level test pattern for a semiconductor device as claimed in claim 1, wherein the heater is a poly heater formed below the current applying pad.

7. The metal line package level test pattern for a semiconductor device as claimed in claim 1, wherein the heater includes a metal pattern for sensing the temperature of the heater.

8. A method of a metal line package level test pattern for a semiconductor device, including a metal line for test, a current applying pad connected to both ends of the metal line, for applying a current to the metal line, and a voltage sensing pattern formed at both ends of the metal line, for sensing a voltage of the metal line, the method comprising the steps of:
   applying a current to both ends of the current applying pad;
   increasing the temperature of the current applying pad to be relatively higher than the metal line; and
   sensing a voltage of the metal line via the voltage sensing pattern.

9. The method as claimed in claim 8, wherein the step of increasing the temperature of the current applying pad is performed using a heater which is further provided below the current applying pad.

10. The method as claimed in claim 9, wherein the heater is a poly heater, and a metal line pattern is further formed to sense the temperature of the poly heater, to increase the temperature of the current applying pad.

11. The method as claimed in claim 8, wherein the temperature increase of the current applying pad is proportional to a temperature gradient by Joule heating caused during the metal line test.

12. A metal line package level test pattern for a semiconductor device comprising:
   a metal line for test;
   a current applying pad connected to both ends of the metal line, for applying a current to the metal line;
   a voltage sensing pattern formed at both ends of the metal line, for sensing a voltage of the metal line;
   a first heat emitting film formed below the metal line, having a first thickness; and
   a second heat emitting film formed below the current applying pad, having a second thickness thicker than the first thickness.

13. The metal line package level test pattern for a semiconductor device as claimed in claim 12, the first and second heat emitting films are oxide films.

14. The metal line package level test pattern for a semiconductor device as claimed in claim 12, further comprising a connecting area for connecting the current applying pad with the metal line.

15. The metal line package level test pattern for a semiconductor device as claimed in claim 14, wherein the connecting area has either a shape of which width is to be gradually narrowed toward the metal line from the current applying pad or a shape which is connected by a plurality of lines.

16. The metal line package level test pattern for a semiconductor device as claimed in claim 15, wherein a third heat emitting film is formed below the connecting area at a variable thickness between the first thickness and the second thickness.

17. The metal line package level test pattern for a semiconductor device as claimed in claim 12, wherein the first and second heat emitting films are formed on the metal line and the current applying pad, respectively.

18. The metal line package level test pattern for a semiconductor device as claimed in claim 12, wherein the first and second heat emitting films are formed below the metal line and the current applying pad, respectively.

19. The metal line package level test pattern for a semiconductor device as claimed in claim 12, further comprising a metal line in the current applying pad to identify the temperature of the current applying pad.

20. A metal line package level test pattern for a semiconductor device comprising:

a test line for use in a metal line test;

a current applying pad connected to both ends of the test line, for applying a current during the metal line test;

a connecting area for connecting the test line with the current applying pad;

a voltage sensing area connected to both ends of the test line, for sensing a voltage of the test line;

a first heat emitting film formed on the test line;

a second heat emitting film formed on the current applying pad, having a heat emitting efficiency lower than that of the first heat emitting film; and a third heat emitting film formed around the connecting area, having a heat emitting efficiency within the range of the heat emitting efficiency of the first and second heat emitting films.

21. The metal line package level test pattern for a semiconductor device as claimed in claim 20, wherein the first, second and third heat emitting films are oxide films having a first thickness, a second thickness thicker than the first thickness, and a variable thickness between the first thickness and the second thickness, respectively.

22. The metal line package level test pattern for a semiconductor device as claimed in claim 20, wherein the first, second and third heat emitting films are formed either on or below the test line, the current applying pad and the connecting area, respectively.

* * * * *